(12) United States Patent
Boone

(10) Patent No.: US 6,673,227 B2
(45) Date of Patent: Jan. 6, 2004

(54) PROCESS FOR PRODUCING THREE-DIMENSIONAL, SELECTIVELY METALLIZED PARTS

(75) Inventor: Luc Boone, Oostkamp (BE)

(73) Assignee: Siemens Production & Logistics Systems AG, Nuremberg (DE)

( * ) Notice: Subject to any disclaimer, the term of this patent is extended or adjusted under 35 U.S.C. 154(b) by 356 days.

(21) Appl. No.: 09/835,335

(22) Filed: Apr. 16, 2001

(65) Prior Publication Data

US 2001/0045361 A1 Nov. 29, 2001

(30) Foreign Application Priority Data

May 29, 2000 (DE) .......................... 100 26 640

(51) Int. Cl.$^7$ ............... C25D 5/00; C23C 18/54; B05D 5/12
(52) U.S. Cl. ............. 205/136; 205/118; 205/187; 205/210; 205/223; 427/271; 427/404; 427/443.1; 264/250
(58) Field of Search ................. 205/118, 136, 205/187, 210, 223; 427/117, 123, 125, 271, 404, 443.1; 264/250

(56) References Cited

U.S. PATENT DOCUMENTS 4,600,480 A * 7/1986 Coombes et al. ............ 205/96
5,185,185 A * 2/1993 Nishizawa et al. .......... 427/304
5,525,205 A * 6/1996 Miyashita ................... 205/126
6,042,425 A * 3/2000 Moller et al. ............... 439/638
6,331,239 B1 * 12/2001 Shirota et al. .............. 205/167
2002/0045058 A1 * 4/2002 Bittrich et al. .............. 428/626

OTHER PUBLICATIONS

A.F.P.M. van Veggel: "Haftfeste Metallisierung von technischen Kunststoffen" [strongly adhering metallization of industrial plastics], *Report on the 15th Ulm Meeting, May 6 and 7, 1993 in Neu–Ulm, Eugen G. Leuze Verlag, Saulgau,* pp. 114–120.

* cited by examiner

Primary Examiner—Nam Nguyen
Assistant Examiner—Brian L Mutschler
(74) Attorney, Agent, or Firm—Laurence A. Greenberg; Werner H. Stemer; Ralph E. Locher

(57) ABSTRACT

The parts are produced by two-component injection molding. Those regions that are to be metallized consist of a first plastic and those regions that are not to be metallized consist of a second plastic. After the entire surface of the parts has been seeded, the seeding is selectively removed with the aid of a solvent in the regions which are not to be metallized. The first plastic is insoluble and the second plastic soluble in the solvent. The selective metallization then takes place by electroless metal deposition and, if appropriate, electrodeposition of metal.

23 Claims, 3 Drawing Sheets

PROCESS FOR PRODUCING THREE-DIMENSIONAL, SELECTIVELY METALLIZED PARTS

BACKGROUND OF THE INVENTION

Field of the Invention

The invention relates to a method of producing three-dimensional, selectively metallized parts, and three-dimensional, selectively metallized part.

The metallization of plastics using the electrodeposition technique enables the product to be completely metallized without additional measures. However, for most applications only partial metallization of the product is desired. There are various options for selective metallization. For example, a product can be injection-molded in two steps using two different plastics (two-component injection molding), in which case one plastic is metallizable and the other plastic is not metallizable. In that case, first of all a part is injection-molded from one plastic, and the part is then placed into a mold and completed by the injection molding of the other plastic. If the product is then metallized using a specific method, one plastic is metallized and the other is not metallized. Selective metallization can also be achieved by using light-sensitive resists. In this case, the entire product is initially provided with a thin, conductive metal layer by means of a chemical process. Then, a photoresist is applied and a pattern is produced in the resist by selective exposure and development. This pattern is reinforced by electrodeposition, and the photoresist can then be removed. It is now possible to remove the initial layer in an etching process, so that what remains is the pattern which has been grown on. A further possibility for selective metallization is made possible by the use of lasers. In that case, after metallization of the entire surface, the undesired metal layers can be removed locally by laser ablation (see, Report on the 15th Ulm Meeting on May 6 and 7, 1993 in Neu-Ulm, Eugen G. Leuze Verlag, Saulgau, pages 114–20, A. F. P. M. van Veggel "Haftfeste Metallisierung von technischen Kunststoffen" [Strongly adhering metallization of industrial plastics]).

In a variant of the production of selectively metallized products by two-component injection molding, a first core-catalyzed plastic and a second non-core-catalyzed plastic are used. The fact that the seeds have already been admixed with the first plastic means that in this case there is no need for wet chemical seeding of the injection-molded part. The subsequent metallization in a chemical metal deposition bath then results in selective deposition of metal in those regions which consist of the core-catalyzed plastic.

SUMMARY OF THE INVENTION

It is accordingly an object of the invention to provide a selectively metallized three-dimensional part and a production method, which overcome the above-mentioned disadvantages of the heretofore-known devices and methods of this general type and which allows simple and economical selective metallization of the three-dimensional parts.

With the foregoing and other objects in view there is provided, in accordance with the invention, a method of producing three-dimensional, selectively metallized parts from electrically insulating material, which comprises the following method steps:

producing three-dimensional parts by two-component injection molding, the parts having first regions to be metallized formed of a first plastic and second regions that are not to be metallized formed of a second plastic;

seeding an entire surface of the part;

selectively removing the seeding in the second regions that are not to be metallized aided by a solvent in which the first plastic is at least substantially insoluble and in which the second plastic is at least substantially soluble; and depositing metal by electroless metal deposition in the first regions that are to be metallized.

The invention is based on the discovery that seeding of the entire surface of parts produced by two-component injection molding can be selectively removed by a solvent. This solvent must not attack the first plastic used in the regions which are to be metallized while it should readily dissolve the second plastic used in the regions which are not to be metallized, so that the seeding is selectively removed again in these regions. Then, subsequent electroless deposition of metal results in selective metallization of the regions which consist of the first plastic, since seeding is still present in those regions.

In accordance with an added feature of the invention, the electrolessly deposited metal layers are reinforced by electrodeposition. Reinforced metallization of this nature is particularly expedient for conductor patterns.

In accordance with an additional feature of the invention, seeding in a palladium system allows particularly effectively catalyzed electroless metal deposition in the regions which are to be metallized.

In accordance with another feature of the invention, the seeding is selectively removed using lye solution as the solvent. In this case, the fact that a first group of plastics is resistant to lye while a second group of plastics is soluble in lye is exploited. According to further refinements, PA and PS are preferably used as the first plastic which is resistant to lye. Similarly, LCP, PEI, PET, and PBT are good candidates for the second plastic, which is soluble in lye. Solvents based on KOH or NaOH are preferably used for the selective removal of the seeding. It is thereby possible to use pure KOH and pure NaOH, as well as mixtures of solvents which contain KOH or NaOH as the crucial component.

In accordance with a further feature of the invention, the seeding is selectively removed with acid as the solvent. In this case, the fact that a first group of plastics is resistant to acid while a second group of plastics is soluble in acid is exploited. In a preferred group, LCP, PEI, PET or PBT is preferably used as the first plastic, which is resistant to acid. Similarly, PA or PS is preferably used as the second plastic, which is soluble in acid. Furthermore, solvents based on HCl or $H_2SO_4$ or mixtures of $C_3O_3$ and $H_2SO_4$ or mixtures of $CCl_3$—COOH and $H_2SO_4$ are preferably used for the selective removal of the seeding. It is thereby possible to use substantially pure HCl or pure $H_2SO_4$, or solvent mixtures which contain HCl or $H_2SO_4$ as the crucial components.

With the above and other objects in view there is also provided, in accordance with the invention, a three-dimensional, selectively metallized part which in the metallized regions consists of a first plastic and in the non-metallized regions consists of a second plastic. The first and second plastics have particular properties which are defined by the solubility in a predetermined solvent. The first plastic is at least substantially insoluble in a predetermined, specific solvent, while the second plastic is at least substantially soluble in the same solvent. For example, the first plastic is able to withstand lye, while the second plastic is soluble in lye. However, the first plastic may also be able to withstand acid while the second plastic is soluble in acid. These materials properties allow selective removal of seeding in lye or in acid during the production of the three-dimensional, selectively metallized parts.

Other features which are considered as characteristic for the invention are set forth in the appended claims.

Although the invention is illustrated and described herein as embodied in a process for producing three-dimensional, selectively metallized parts, and three-dimensional, selectively metallized part, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
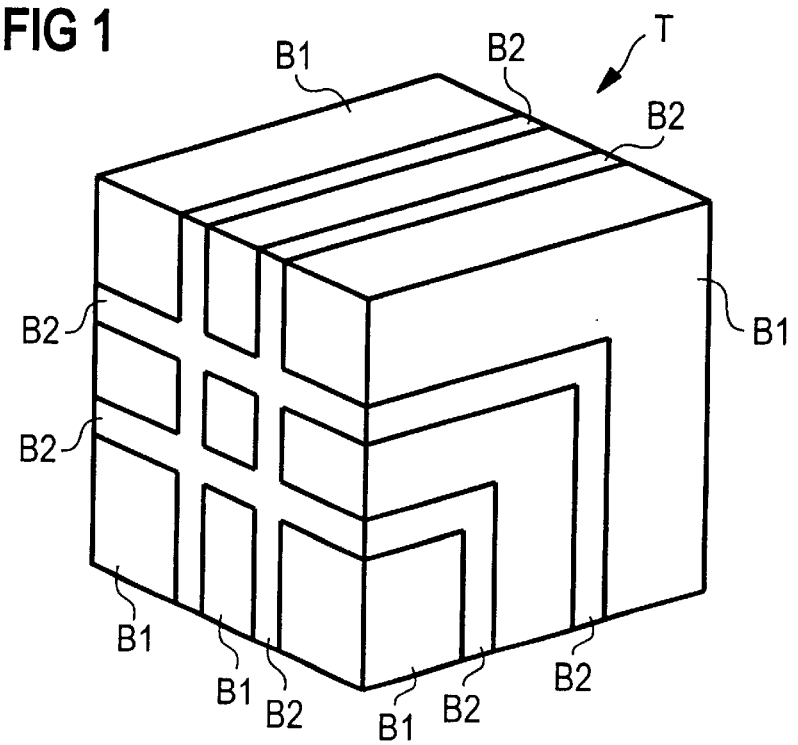
FIG. 1 is a perspective view of a three-dimensional part produced by two-component injection molding.

Referring now to the figures of the drawing in detail and first, particularly, to FIG. 1 thereof, there is shown cube-shaped or cuboid part T which has been produced by two-component injection molding from a first plastic and a second, different plastic. The regions which consist of the first plastic and are subsequently to be metallized are denoted by B1, while the regions which consist of the second plastic and are not to be metallized are denoted by B2.

Figure 2:
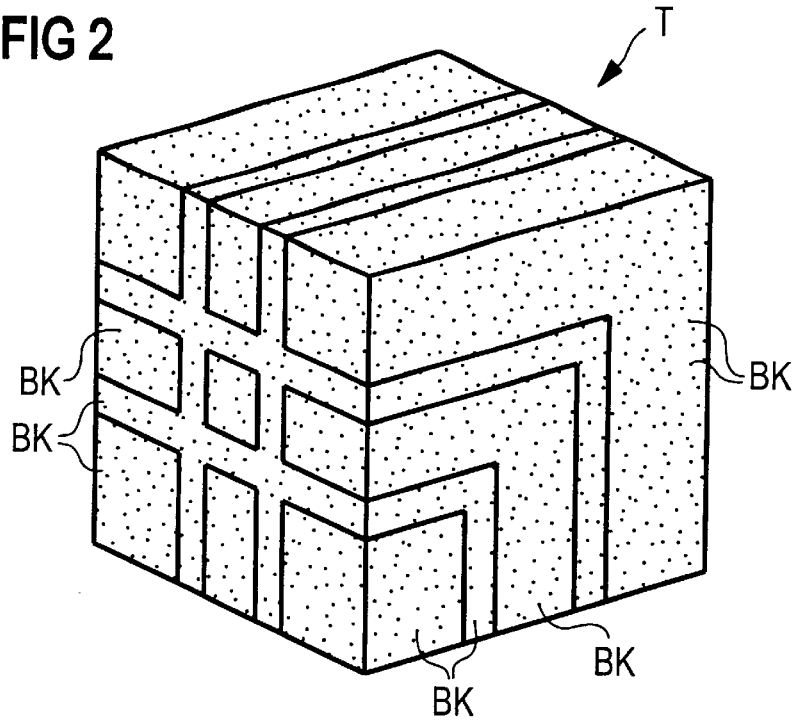
FIG. 2 is a perspective view of the part shown in FIG. 1 after seeding of the entire surface.

FIG. 2 shows the part T illustrated in FIG. 1 after a wet chemical seeding process has been performed. The seeding of the entire surface of the part T is indicated by small particles denoted by BK. In the case of treatment in a palladium system, the seeding BK is formed by palladium seeds.

Figure 3:
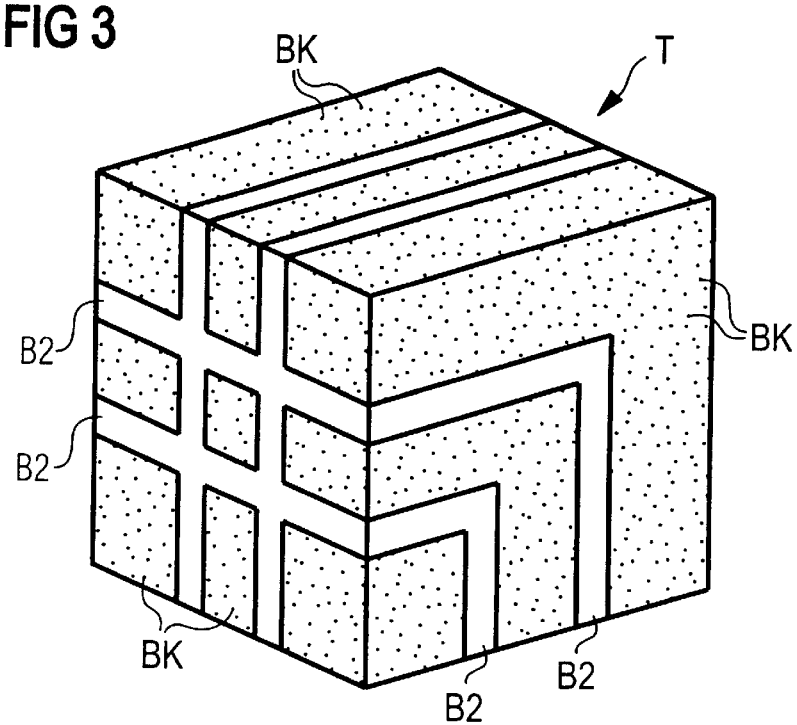
FIG. 3 is a perspective view of the part shown in FIG. 2 after selective removal of the seeding.

FIG. 3 shows the same part T after selective removal of the seeding BK in the regions B2 which are not to be metallized. This selective removal of the seeding BK is effected by immersing the part T in a solvent in which the first plastic is insoluble and in which the second plastic is soluble. The incipient dissolution of the second plastic in the regions B2 which are not to be metallized causes the seeding BK to be dissolved off, while it remains in the regions B1 which are to be metallized (cf. FIG. 1).

Figure 4:
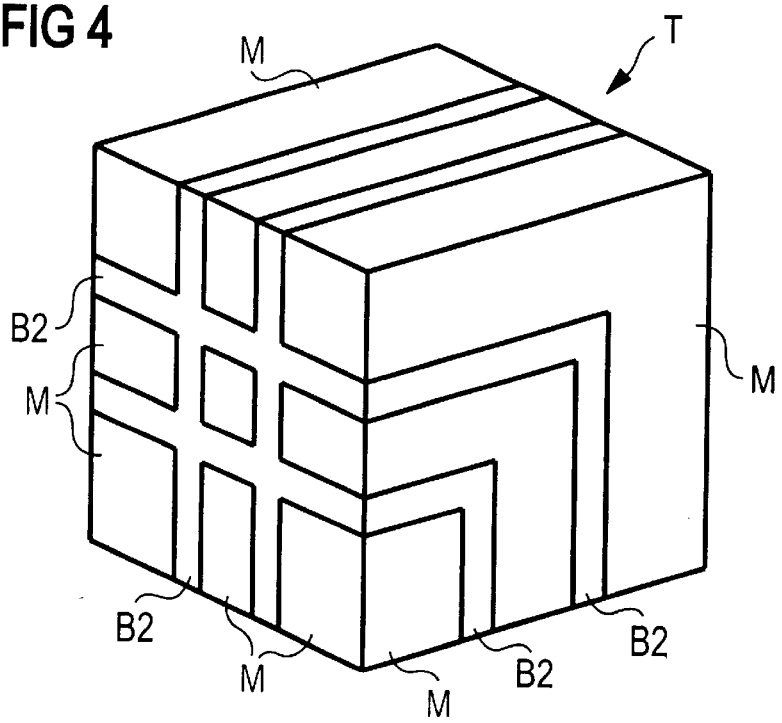
FIG. 4 is a perspective view of the part shown in FIG. 3 after selective metallization.

FIG. 4 shows the same part T after the selective metallization of the regions B2. The surfaces which are catalytically active as a result of the finely distributed seeding BK in the regions B1 (cf. FIG. 1) initiate the deposition of a base metallization when the part is immersed in a chemically electrolessly operating bath. After the metallization has grown over the seeding BK, the deposition continues autocatalytically until the resulting metallization M reaches the desired layer thickness. In the exemplary embodiment described, the metallization M was reinforced by subsequent electrodeposition of metal, i.e., it was galvanized.

Figure 5:
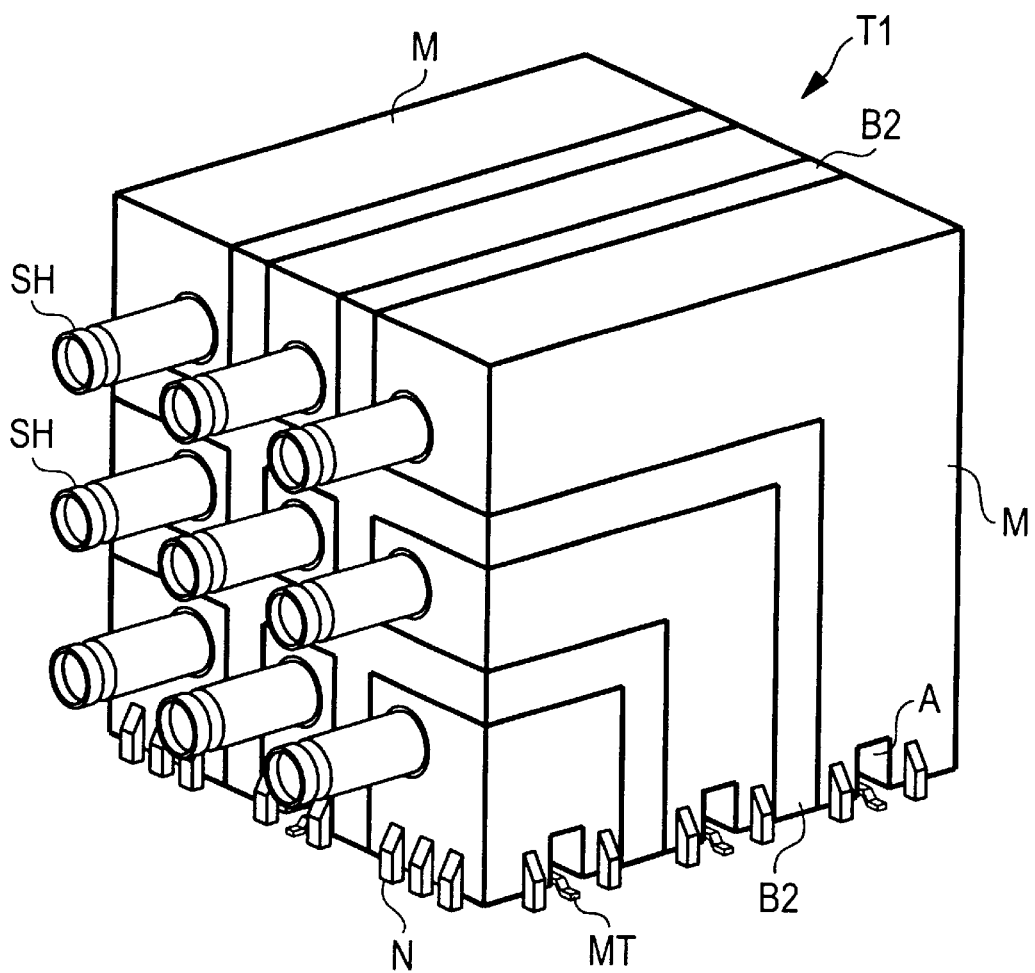
FIG. 5 is a perspective view of a coaxial connector.

FIG. 5 shows a coaxial connector, the base of which forms a selectively metallized part T1. The part T1 substantially corresponds to the part T described above, and the selective metallization M is also produced in the manner described. Connector sleeves SH of the coaxial connector have been inserted into the front side of the part T1, while integrally molded lugs N which project downwards slightly are provided on the outer lower edge of the part T1. The lugs N consist of the first plastic, i.e. the metallization M also extends over the lugs N. At the lower edge of the part T1 there are also cutouts A, into which stamped metal parts MT are inserted. These metal parts MT are connected in an electrically conductive manner, which cannot be seen in the drawing, to the internal conductors of the connector sleeves SH, which likewise cannot be seen. It can be also seen from FIG. 5 that the lower surfaces of the lugs N and of the metal parts MT lie at the same height in one plane and therefore allow SMD mounting (SMD—surface mounted device) on a circuit board or the like.

Various examples for the production of the parts T illustrated in FIGS. 1 to 4 are described below; these examples can, of course, also be transferred to the production of the coaxial connector illustrated in FIG. 5.

EXAMPLE 1

The part T illustrated in FIG. 1 is produced by two-component injection molding, the regions B1 which are to be metallized consisting of PA (polyamide) and the regions B2 which are not to be metallized consisting of LCP (liquid crystal polymer). The seeding BK as shown in FIG. 2 is produced by wet chemical means in a palladium system. The subsequent selective removal of the palladium seeds in the regions B2 as shown in FIG. 3 takes place by immersing the part T in a solution of KOH (potash lye) in water. After a rinsing operation, the metallization M as shown in FIG. 4 was then produced by electroless deposition of copper and subsequent electrodeposition of copper in conventional commercially available baths.

EXAMPLE 2

The difference from Example 1 is that the regions B1 which are to be metallized consist of PS (polystyrene).

EXAMPLE 3

The difference from Example 1 is that the regions B2 which are not to be metallized consist of PEI (polyetherimide).

EXAMPLE 4

The difference from Example 2 is that the regions B2 which are not to be metallized consist of PEI (polyetherimide).

EXAMPLE 5

The difference from Example 1 is that the regions B2 which are not to be metallized consist of PET (polyethylene terephthalate).

EXAMPLE 6

The difference from Example 1 is that the regions B2 which are not to be metallized consist of PBT (polybutylene terephthalate).

EXAMPLE 7

The difference from Example 1 is that a solution of NaOH (soda lye) in water is used for the selective removal of the palladium seeds.

EXAMPLE 8

The difference from Example 2 is that a solution of NaOH (soda lye) in water is used for the selective removal of the palladium seeds.

EXAMPLE 9

The difference from Example 3 is that a solution of NaOH (soda lye) in water is used for the selective removal of the palladium seeds.

EXAMPLE 10

The difference from Example 4 is that a solution of NaOH (soda lye) in water is used for the selective removal of the palladium seeds.

EXAMPLE 11

The difference from Example 5 is that a solution of NaOH (soda lye) in water is used for the selective removal of the palladium seeds.

EXAMPLE 12

The difference from Example 6 is that a solution of NaOH (soda lye) in water is used for the selective removal of the palladium seeds.

EXAMPLE 13

The part T illustrated in FIG. 1 is produced by two-component injection molding, the regions B1 which are to be metallized consisting of LCP (liquid crystal polymer) and the regions B2 which are not to be metallized consisting of PA (polyamide). The seeding BK as shown in FIG. 2 is produced by wet chemical means in a palladium system. The subsequent selective removal of the palladium seeds in the regions B2 as shown in FIG. 3 takes place by immersing the part T in a solution of concentrated hydrochloric acid in water, each component forming 50% by volume. After a rinsing operation, the metallization M as shown in FIG. 4 was then produced by electroless deposition of copper and subsequent electrodeposition of copper in conventional commercially available baths.

EXAMPLE 14

The difference from Example 13 is that the regions B1 which are to be metallized consist of PEI (polyetherimide).

EXAMPLE 15

The difference from Example 13 is that the regions B1 which are to the metallized consist of PET (polyethylene terephthalate).

EXAMPLE 16

The difference from Example 13 is that the regions B1 which are to be metallized consist of PBT (polybutylene terephthalate).

EXAMPLE 17

The difference from Example 13 is that the regions B2 which are not to be metallized consist of PS (polystyrene).

EXAMPLE 18

The difference from Example 14 is that the regions B2 which are not to be metallized consist of PS (polystyrene).

EXAMPLE 19

The difference from Example 15 is that the regions B2 which are not to be metallized consist of PS (polystyrene).

EXAMPLE 20

The difference from Example 16 is that the regions B2 which are not to be metallized consist of PS (polystyrene).

EXAMPLE 21

The difference from Example 13 is that a solution of 50% strength $H_2SO_4$ (sulfuric acid) in water is used for the selective removal of the palladium seeds.

EXAMPLE 22

The difference from Example 14 is that a solution of 50% strength $H_2SO_4$ (sulfuric acid) in water is used for the selective removal of the palladium seeds.

EXAMPLE 23

The difference from Example 15 is that a solution of 50% strength $H_2SO_4$ (sulfuric acid) in water is used for the selective removal of the palladium seeds.

EXAMPLE 24

The difference from Example 16 is that a solution of 50% strength $H_2SO_4$ (sulfuric acid) in water is used for the selective removal of the palladium seeds.

EXAMPLE 25

The difference from Example 17 is that a solution of 50% strength $H_2SO_4$ (sulfuric acid) in water is used for the selective removal of the palladium seeds.

EXAMPLE 26

The difference from Example 18 is that a solution of 50% strength $H_2SO_4$ (sulfuric acid) in water is used for the selective removal of the palladium seeds.

EXAMPLE 27

The difference from Example 19 is that a solution of 50% strength $H_2SO_4$ (sulfuric acid) in water is used for the selective removal of the palladium seeds.

EXAMPLE 28

The difference from Example 20 is that a solution of 50% $H_2SO_4$ (sulfuric acid) in water is used for the selective removal of the palladium seeds.

EXAMPLE 29

The difference from Example 13 is that a solution of 300 g/l of $CrO_3$ (chromic acid) and 300 g/l of $H_2SO_4$ (sulfuric acid) in water is used for the selective removal of the palladium seeds.

EXAMPLE 30

The difference from Example 14 is that a solution of 300 g/l of $CrO_3$ (chromic acid) and 300 g/l of $H_2SO_4$ (sulfuric acid) in water is used for the selective removal of the palladium seeds.

EXAMPLE 31

The difference from Example 15 is that a solution of 300 g/l of $CrO_3$ (chromic acid) and 300 g/l of $H_2SO_4$ (sulfuric acid) in water is used for the selective removal of the palladium seeds.

EXAMPLE 32

The difference from Example 16 is that a solution of 300 g/l of $CrO_3$ (chromic acid) and 300 g/l of $H_2SO_4$ (sulfuric acid) in water is used for the selective removal of the palladium seeds.

EXAMPLE 33

The difference from Example 17 is that a solution of 300 g/l of $CrO_3$ (chromic acid) and 300 g/l of $H_2SO_4$ (sulfuric acid) in water is used for the selective removal of the palladium seeds.

EXAMPLE 34

The difference from Example 18 is that a solution of 300 g/l of $CrO_3$ (chromic acid) and 300 g/l of $H_2SO_4$ (sulfuric acid) in water is used for the selective removal of the palladium seeds.

EXAMPLE 35

The difference from Example 19 is that a solution of 300 g/l of $CrO_3$ (chromic acid) and 300 g/l of $H_2SO_4$ (sulfuric acid) in water is used for the selective removal of the palladium seeds.

EXAMPLE 36

The difference from Example 20 is that a solution of 300 g/l of $CrO_3$ (chromic acid) and 300 g/l of $H_2SO_4$ (sulfuric acid) in water is used for the selective removal of the palladium seeds.

EXAMPLE 37

The difference from Example 13 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 38

The difference from Example 14 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 39

The difference from Example 15 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 40

The difference from Example 16 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 41

The difference from Example 17 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 42

The difference from Example 18 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 43

The difference from Example 19 is that a solution of 150 g/l of $CCl_3$—COOH (trichloroacetic acid) and 150 g/l of $H_2SO_4$ (sulfuric acid) in water is used for the selective removal of the palladium seeds.

EXAMPLE 44

The difference from Example 20 is that a solution of 150 g/l of $CCl_3$—COOH (trichloroacetic acid) and 150 g/l of $H_2SO_4$ (sulfuric acid) in water is used for the selective removal of the palladium seeds.

In Examples 1 to 44 above, the treatment time for the removal of the seeds was in the neighborhood of 5 minutes. The temperature of the solvents used was in the neighborhood of 50° C. The concentration of the solvents used was set in such a way that reliable removal of the seeding BK was ensured in the regions B2 which are not to be metallized.

I claim:

1. A method of producing a three-dimensional, selectively metallized part from electrically insulating material, which comprises the following method steps:

produce a three-dimensional part by two-component injection molding, the part having at least one first region to be metallized formed of a first plastic and at least one second region that is not to be metallized formed of a second plastic;

seeding an entire surface of the part;

selectively removing the seeding in the second region that is not to be metallized aided by a solvent in which the first plastic is at least substantially insoluble and in which the second plastic is at least substantially soluble; and depositing metal by electroless metal deposition in the first region that is to be metallized.

2. The method according to claim 1, which comprises reinforcing the metal deposited in the depositing step by electrodeposition of metal.

3. The method according to claim 1, wherein the seeding step comprises seeding the part with palladium.

4. The method according to claim 1, which comprises selecting the first plastic to be at least substantially insoluble in lye, and selecting the second plastic to be at least substantially soluble in lye, and which comprises using lye in the step of selectively removing the seeding.

5. The method according to claim 4, wherein the first plastic is PA.

6. The method according to claim 4, wherein the first plastic is PS.

7. The method according to claim 4, wherein the second plastic is selected from the group consisting of LCP, PEI, PET, and PBT.

8. The method according to claim 5, wherein the second plastic is selected from the group consisting of LCP, PEI, PET, and PBT.

9. The method according to claim 6, wherein the second plastic is selected from the group consisting of LCP, PEI, PET, and PBT.

10. The method according to claim 4, which comprises selectively removing the seeding with a solvent based on a solvent selected from the group consisting of KOH and NaOH.

11. The method according to claim 5, which comprises selectively removing the seeding with a solvent based on a solvent selected from the group consisting of KOH and NaOH.

12. The method according to claim 7, which comprises selectively removing the seeding with a solvent based on a solvent selected from the group consisting of KOH and NaOH.

13. The method according to claim 1, which comprises selecting as the first plastic a plastic that is at least substantially insoluble in acid, selecting as the second plastic a plastic that is at least substantially soluble in acid, and using acid as the solvent for selectively removing the seeding.

14. The method according to claim 13, wherein the first plastic is a plastic selected from the group consisting of LCP, PEI, PET, and PBT.

15. The method according to claim 14, wherein the second plastic is a plastic selected from the group consisting of PA and PS.

16. The method according to claim 13, wherein the second plastic is a plastic selected from the group consisting of PA and PS.

17. The method according to claim 16, which comprises selecting for the selective removal of the seeding a solvent from the group consisting of HCl, $H_2SO_4$, and a mixture of $CrO_3$ and $H_2SO_4$.

18. The method according to claim 14, which comprises selecting for the selective removal of the seeding a solvent from the group consisting of HCl, $H_2SO_4$, and a mixture of $CrO_3$ and $H_2SO_4$.

19. The method according to claim 15, which comprises selecting for the selective removal of the seeding a solvent from the group consisting of HCl, $H_2SO_4$, and a mixture of $CrO_3$ and $H_2SO_4$.

20. The method according to claim 13, which comprises selecting for the selective removal of the seeding a solvent from the group consisting of HCl, $H_2SO_4$, and a mixture of $CrO_3$ and $H_2SO_4$.

21. The method according to claim 13, which comprises selecting a mixture of $CCl_3$—COOH and $H_2SO_4$ as a solvent for the selective removal of the seeding.

22. The method according to claim 14, which comprises selecting a mixture of $CCl_3$—COOH and $H_2SO_4$ as a solvent for the selective removal of the seeding.

23. The method according to claim 16, which comprises selecting a mixture of $CCl_3$—COOH and $H_2SO_4$ as a solvent for the selective removal of the seeding.

* * * * *